US011545434B2

(12) United States Patent
Cheah et al.

(10) Patent No.: US 11,545,434 B2
(45) Date of Patent: Jan. 3, 2023

(54) VERTICAL DIE-TO-DIE INTERCONNECTS BRIDGE

(71) Applicant: Intel Corporation, Santa Clara, CA (US)

(72) Inventors: Bok Eng Cheah, Gelugor Pulau Pinang (MY); Yang Liang Poh, Bukit Mertajam Pulau Pinang (MY); Kooi Chi Ooi, Gelugor Pulau Pinang (MY)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 16/987,405

(22) Filed: Aug. 7, 2020

(65) Prior Publication Data

US 2021/0384130 A1    Dec. 9, 2021

(30) Foreign Application Priority Data

Jun. 5, 2020 (MY) .......................... PI2020002901

(51) Int. Cl.
| | |
|---|---|
| *H01L 23/538* | (2006.01) |
| *H01L 25/065* | (2006.01) |
| *H01L 21/48* | (2006.01) |
| *H01L 25/00* | (2006.01) |

(52) U.S. Cl.
CPC ...... *H01L 23/5383* (2013.01); *H01L 21/4857* (2013.01); *H01L 23/5381* (2013.01); *H01L 25/0652* (2013.01); *H01L 25/50* (2013.01)

(58) Field of Classification Search
CPC ............ H01L 21/4857; H01L 23/5383; H01L 23/5381; H01L 25/0652; H01L 25/50

USPC ........................................................ 257/693
See application file for complete search history.

(56) References Cited

U.S. PATENT DOCUMENTS

2010/0078784 A1* 4/2010 Otremba ........... H01L 23/49562
                                                        257/676
2019/0304912 A1* 10/2019 Ecton ................... H01L 23/5381

OTHER PUBLICATIONS

Mahajan, R. et al.; "Embedded Multi-Die Interconnect Bridge (EMIB)—A High Density, High Bandwidth Packaging nterconnect"; May 31, 2016; pp. 557-565; 2016 IEEE 66th Electronic Components and Technology Conference (ECTC); Las Vegas, NV, USA.

* cited by examiner

*Primary Examiner* — Monica D Harrison
(74) *Attorney, Agent, or Firm* — Viering, Jentschura & Partner mbB

(57) ABSTRACT

The present disclosure relates to a semiconductor package that may include a substrate. The substrate may have a top surface and a bottom surface. The semiconductor package may include an opening in the substrate. The semiconductor package may include a bridge disposed in the opening. The bridge may have an upper end at the top surface of the substrate and a lower end at the bottom surface of the substrate. The semiconductor package may include a first die on the top surface of the substrate at least partially extending over a first portion of the upper end of the bridge. The semiconductor package may include a second die on the bottom surface of the substrate at least partially extending over the lower end of the bridge. The bridge may couple the first die to the second die.

17 Claims, 10 Drawing Sheets

VERTICAL DIE-TO-DIE INTERCONNECTS BRIDGE

CROSS-REFERENCE TO RELATED APPLICATIONS

This application claims priority to Malaysian Patent Application PI2020002901, which was filed on Jun. 5, 2020, the entire contents of which are hereby incorporated herein by reference.

BACKGROUND

High bandwidth interconnects on a semiconductor package are becoming relevant in high performance computing. Current solutions to support high density device integration within a single semiconductor package include interconnect trace width and trace spacing geometry scaling through a silicon lithography-based component, e.g., a silicon interposer, and use of an embedded multi-die interconnect bridge (EMIB).

Silicon interposers are expensive and must enclose the entire die complex and utilise "through-silicon-vias" (TSV) for all top die to package connections. On the other hand, a typical EMIB includes a small silicon bridge chip that is embedded in a semiconductor package substrate, enabling very high density die-to-die interconnections only where needed, such as with fine line and spaced traces.

Both silicon interposer and EMIB solutions require package z-height and/or real estate trade-off due to additional bridge component thickness and associated keep-out zone requirements or design rules constraints, e.g., increased dielectric thickness, etc.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
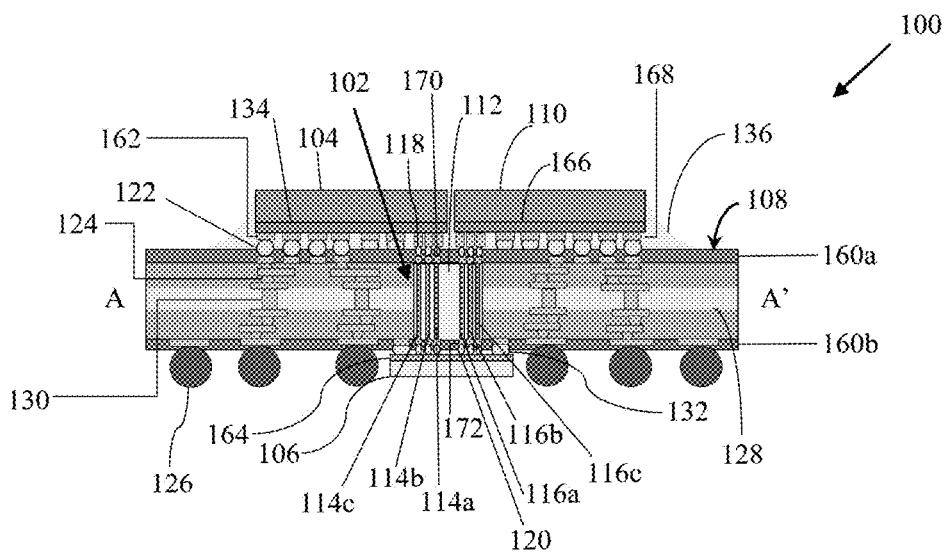
FIG. 1A shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for devices, and various aspects are provided for methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

The present disclosure generally relates to a device, e.g. a semiconductor package, that may include a substrate. The substrate may have a top surface and a bottom surface. The device may include an opening in the substrate. The device may include a bridge in the opening. The bridge may have an upper end at the top surface of the substrate and a lower end at the bottom surface of the substrate. The device may include a first die on the top surface of the substrate at least partially extending over a first portion of the upper end of the bridge. The device may include a second die on the bottom surface of the substrate at least partially extending over the lower end of the bridge. The bridge may couple the first die to the second die.

In various aspects of the present disclosure, the device may further include a third die on the top surface of the substrate at least partially extending over a second portion of the upper end of the bridge. The bridge may further couple the third die to the second die.

The present disclosure also generally relates to a computing device. The computing device may include a device, e.g. a semiconductor package. The device may include a substrate. The substrate may have a top surface and a bottom surface. The device may include an opening in the substrate. The device may include a bridge in the opening. The bridge may have an upper end at the top surface of the substrate and a lower end at the bottom surface of the substrate. The device may include a first die on the top surface of the substrate at least partially extending over a first portion of the upper end of the bridge. The device may include a second die on the bottom surface of the substrate at least partially extending over the lower end of the bridge. The bridge may couple the first die to the second die. The computing device may include a circuit board, wherein the device may be coupled to the circuit board.

In various aspects of the present disclosure, the computing device may further include a third die on the top surface of the substrate at least partially extending over a second portion of the upper end of the bridge. The bridge may further couple the third die to the second die.

The present disclosure further generally relates to a method. The method may include providing a substrate. The substrate may have a top surface and a bottom surface. The method may include forming an opening in the substrate. The method may include providing a bridge. The method may include disposing the bridge in the opening. The bridge may have an upper end at the top surface of the substrate and a lower end at the bottom surface of the substrate. The method may include providing a first die on the top surface of the substrate and coupling the first die to the upper end of the bridge, wherein the first die at least partially extending over a first portion of the upper end of the bridge. The method may include providing a second die on the bottom surface of the substrate and coupling the second die to lower end of the bridge, wherein the second die at least partially extending over the lower end of the bridge.

In various aspects of the present disclosure, the method may further include providing a third die on the top surface of the substrate at least partially extending over a second portion of the upper end of the bridge. The bridge may further couple the third die to the second die.

A technical effect or advantage of the present disclosure may include the achievement of a device form-factor miniaturization through the double-sided placement of silicon components on opposing surfaces of a semiconductor package substrate, thereby allowing a compact multichip package with a miniaturized package footprint and a reduced substrate routing layer count.

Another technical effect or advantage of the present disclosure may include an improved signaling performance between the top and bottom silicon devices through minimized channel impedance discontinuities (i.e., reflection or return loss) across package vertical interconnect; reduced electromagnetic interference (EMI), e.g. signal crosstalk coupling through reduced signal current return path to the voltage reference plane, e.g., from 150 µm (conventional plated-through-hole (PTH) interconnects spacing between a signal PTH and adjacent PTH associated to a reference voltage) to 25 µm (distance between a vertical signal trace to adjacent voltage reference plane).

Yet another technical effect or advantage of the present disclosure may include an improved device bandwidth performance between the top and bottom silicon devices through improved interconnect density, e.g. from 800 µm per routing pair (conventional PTH) to 50 µm per routing pair.

A further technical effect or advantage of the present disclosure may include an improved power integrity performance through an integrated decoupling capacitor to the vertical bridge component and a reduced alternating current (AC) loop inductance and suppresses power delivery network peak impedance ($Z_{PDN}$).

To more readily understand and put into practical effect the present disclosure, particular aspects will now be described by way of examples and not limitations, and with reference to the drawings. For the sake of brevity, duplicate descriptions of features and properties may be omitted.

FIG. 1A shows a cross-sectional view of a semiconductor package according to an aspect of the present disclosure. In this illustration, it is shown a semiconductor package 100, e.g., a multichip package (MCP) assembly, with a bridge 102 embedded therein for increased device integration and miniaturization. The cross-section is taken along the A-A' line of FIG. 1B.

The term "multichip package" generally refers to a semiconductor package that may include two or more dies, chips, or chiplets (interchangeably used herein) that may be arranged laterally along the same plane. As different types of devices cater to different types of applications, more dies may be required in some systems to meet the requirements of high performance applications. Accordingly, to obtain better performance and higher density, in various aspects of the present disclosure, the semiconductor package may include multiple dies arranged laterally along the same plane, and additional die(s) arranged in a different plane, i.e., 2.5/3D packaging. Consequently, a bridge may be provided herein to couple the multiple dies arranged along the same plane to additional die(s) arranged in a different plane. In various aspects of the present disclosure, the multiple dies and the additional die(s) may be arranged in parallel lateral planes and the bridge may couple the multiple dies to the additional die(s) in a vertical manner, and hence, the bridge may also be referred to herein as a vertical bridge.

In FIG. 1A, the semiconductor package 100 may have a substrate 108. The substrate 108 may have contact pads, electrical interconnects and routings, and other features, which may or may not be shown in any of the present figures and which are conventional features known to a person skilled in the art. Various couplings of the components may use conventional methods, including solder bonding, thermal compression bonding or other metal diffusion method. The substrate 108 may have one or more rigid core layer 128 for improved structural stability. The substrate 108 may include a plated-through-hole (PTH) arrangement 130 therein. Alternatively, the substrate 108 may be a coreless substrate for a reduced form-factor. In other aspects, the substrate 108 may be part of a larger substrate that supports additional semiconductor packages and/or components. In another aspect, the substrate 108 may be a printed circuit board or motherboard.

As shown in FIG. 1A, a first (silicon) die 104, such as, but not limited to, a central processing unit (CPU), another processor device or an application specific integrated circuit (ASIC) processor, may be disposed on a top surface of the substrate 108. The top surface of the substrate 108 may be referred to as a die side. The first die 104 may include a first die metallization layer 134 that may be used to redistribute metal routing between transistor gates of the first die 104 and the substrate 108 in the semiconductor package 100. The first die metallization layer 134 may further include a plurality of conducting contact pads 162, e.g., a plurality of copper bump pads.

FIG. 1A further shows a second (silicon) die 106, such as, but not limited to, a memory device, a graphic processing unit (GPU), or a sensor device, may be disposed on a bottom surface of the substrate 108. The bottom surface of the substrate 108 may be referred to as a land side that may be opposing to the die side. In other words, the first die 104 and the second die 106 may be arranged in parallel lateral planes. The second die 106 may include a second die metallization layer 164.

The semiconductor package 100 may include an opening or a cavity in the substrate 108 and the bridge 102 may be disposed in the opening. The bridge 102 may have an upper end at the top surface of the substrate 108 and a lower end at the bottom surface of the substrate 108. In other words, the bridge 102 may extend vertically between the die side and the land side of the substrate 108.

In one aspect, the upper end of the bridge 102 may extend beyond the top surface of the substrate 108. In another aspect, the lower end of the bridge 102 may extend beyond the bottom surface of the substrate 108. In a further aspect, both the upper and lower ends of the bridge 102 may extend beyond the top and bottom surfaces of the substrate 108. However, the contact pads 162 and 122 of the above aspects may be adjusted to achieve a leveled interconnect height between the silicon die(s) and the substrate 108.

The first die 104 on the top surface of the substrate 108 may at least partially extend over a first portion of the upper end of the bridge 102. The second die 106 on the bottom surface of the substrate 108 may at least partially extend over the lower end of the bridge 102. In various aspects, the first die 104 and the second die 106 may be arranged in parallel lateral planes, and the bridge 102 may couple the first die 104 to the second die 106 in a vertical manner (i.e., in a different plane to the lateral plane) and may be referred to as a vertical bridge.

A third (silicon) die 110, such as, but not limited to, a platform controller hub (PCH) chipset, a field programmable gate array (FPGA), or an input-output (I/O) tile e.g., a serializer/deserializer (SerDes) tile, may be disposed on the top surface of the substrate 108. The third die 110 on the top surface of the substrate 108 may at least partially extend over a second portion of the upper end of the bridge 102. The third die 110 may include a third die metallization layer 166 that may be used to redistribute metal routing between transistor gates of the third die 110 and the substrate 108 in the semiconductor package 100. The third die metallization layer 166 may further include a plurality of conducting contact pads 168, e.g., a plurality of copper bump pads.

The bridge 102 may further couple the third die 110 to the second die 106. In other words, the first die 104 and the second die 106 may be coupled to the third die 110 through the bridge 102 disposed within the opening in the substrate 108.

In the aspect shown in FIG. 1A, the bridge 102 may include a bridge core 112. In various aspects, the bridge core 112 may be an organic core. The organic core may include an epoxy polymer resin and fiber weave composites, for example. In alternative aspects, the bridge core 112 may be an inorganic core. The inorganic core may include a silicon or glass material, for example.

The bridge core 112 may be perpendicular to the die side and the land side. The bridge 112 may further include a plurality of bridge metallization layers. As shown in FIG. 1A, a first bridge metallization layer may be disposed on a first bridge core surface and a second bridge metallization layer may be disposed on an opposing second bridge core surface. The first bridge metallization layer may couple the first die 104 to the second die 106. The second bridge metallization layer may couple the third die 110 to the second die 106.

The first bridge metallization layer may include a plurality of metal layers (114a, 114b, 114c) interleaved with dielectric layers. In other words, the first bridge metallization layer may include alternating layers of a metal layer and a bridge dielectric layer. In various aspects, the plurality of metal layers (114a, 114b, 114c) may be conductive plane and/or routing layers, e.g., signal routing and voltage reference layers isolated by dielectric layers, and may be a primary electrical coupling between the first die 104 and the second die 106.

In one aspect, the plurality of metal layers (114a, 114b, 114c) of the first bridge metallization layer may include a first voltage reference plane 114a, a signal interconnect layer 114b and a second voltage reference plane 114c arranged in this order. In other words, a metal layer of the plurality of metal layers of the first bridge metallization layer may include a signal interconnect layer 114b and another metal layer of the plurality of metal layers of the first bridge metallization layer may include the first voltage reference layer 114a or second voltage reference layer 114c interleaving with a bridge dielectric layer.

In an aspect, the first voltage reference layer 114a may include a solid plane extending over the signal interconnect layer 114b. In an aspect, the second voltage reference layer 114c may include a solid plane extending over the signal interconnect layer 114b. In an aspect, the first and second voltage reference layers 114a and 114c may include two or more isolated planes extending over the signal interconnect layer 114b. In an aspect, the first and second voltage reference layers 114a and 114c are associated to a reference voltage, e.g., a ground reference voltage (Vss).

The second bridge metallization layer may include a plurality of metal layers (116a, 116b, 116c) interleaved with dielectric layers. In other words, the second bridge metallization layer may include alternating layers of a metal layer and a bridge dielectric layer. In various aspects, the plurality of metal layers (116a, 116b, 116c) may be conductive plane and/or routing layers, e.g., signal routing and voltage reference layers isolated by dielectric layers, and may be a primary electrical coupling between the third die 110 and the second die 106.

In one aspect, the plurality of metal layers (116a, 116b, 116c) of the second bridge metallization layer may include a first voltage reference plane 116a, a signal interconnect layer 116b and a second voltage reference plane 116c arranged in this order. In other words, a metal layer of the plurality of metal layers of the second bridge metallization layer may include a signal interconnect layer 116b and another metal layer of the plurality of metal layers of the second bridge metallization layer may include the first voltage reference layer 116a or second voltage reference layer 116c interleaving with a bridge dielectric layer.

With respect to the first bridge metallization layer, the second bridge metallization layer, or both, a potential advantage of the present disclosure may be achieved by arranging the signal interconnect layer being sandwiched between two voltage reference layers or planes to provide impedance control and shielding from electromagnetic interference, for example, signal crosstalk coupling. In various aspects, the bridge dielectric layer thickness between the signal interconnect layer and the voltage reference plane may range from 15 μm to 50 μm. In various aspects, the thickness of each of the signal interconnect layer and the voltage reference plane may range from 15 μm to 30 μm. In various aspects, the voltage reference layer may be coupled to a ground reference voltage (Vss) or a power supply voltage (Vcc).

In the aspect shown in FIG. 1A, for the first bridge metallization layer side, the signal interconnect layer 114b may include a plurality of continuous metal traces coupled to first die bump pads 170 on the die side and to first land bump pads 172 on the land side. In this arrangement, the signal interconnect layer 114b may be coupled to the first die 104 via the first die bump pads 170 and first die bumps 118 on the die side. The first die bumps 118 on the die side may be coupled to the first die 104 through the first die metallization layer 134 including the plurality of conducting contact pads 162. The signal interconnect layer 114b may further be coupled to the second die 106 via the first land bump pads 172 and first land bumps 120 on the land side.

The same arrangement may also be made for the second bridge metallization layer side in a mirror image to the first bridge metallization layer side. In various aspects, the signal interconnect layer 116b may include a plurality of continuous metal traces coupled to first die bump pads 170 on the die side and to first land bump pads 172 on the land side. In this arrangement, the signal interconnect layer 116b may be coupled to the third die 110 via the first die bump pads 170 and first die bumps 118 on the die side. The first die bumps 118 on the die side may be coupled to the third die 110 through the third die metallization layer 166 including a plurality of conducting contact pads 168. The signal interconnect layer 116b may further be coupled to the second die 106 via the first land bump pads 172 and first land bumps 120 on the land side.

With the above arrangement, high density die-to-die interconnects with robust EMI shielding may be achieved through the bridge 102.

In various aspects, the width of a metal trace of the plurality of continuous metal traces may range from 7 μm to 30 μm and the spacing between two adjacent metal traces may range from 7 μm to 50 μm.

In various aspects shown in FIG. 1A, a solder resist layer 160a may be at least partially disposed over the first die bump pads 170 and another solder resist layer 160b may be at least partially disposed over the first land bump pads 172.

In various aspects, the second die 106 may be coupled to the substrate 108 through a second land-side bump 132 to provide power supply and/or signal transmissions.

In a further aspect, a further second die (not shown) may be provided on the land side and may include a passive device such as, but not limited to, a silicon capacitor, a multilayer ceramic capacitor (MLCC), a resistor, an inductor or a diode.

In various aspects, the first die 104 and the third die 110 may communicate to a circuit board (not shown), for example, a motherboard, through a conventional setup. In one aspect, the first die 104 and the third die 110 may communicate to the circuit board through a second die-side bump 122, a package trace, a vertical via interconnect 124 and a solder ball 126. An underfill layer 136 may be deposited to cover and protect the conductive components of the semiconductor package 100 in a conventional manner.

In the aspect shown in FIG. 1A, the first die-side bump 118 may have a first dimension and the second die-side bump 122 may have a second dimension. The second dimension may be greater than the first dimension. The dimension, in relation to the first dimension and the second dimension, may refer to physical bump diameter and bump pitches.

Figure 1B:
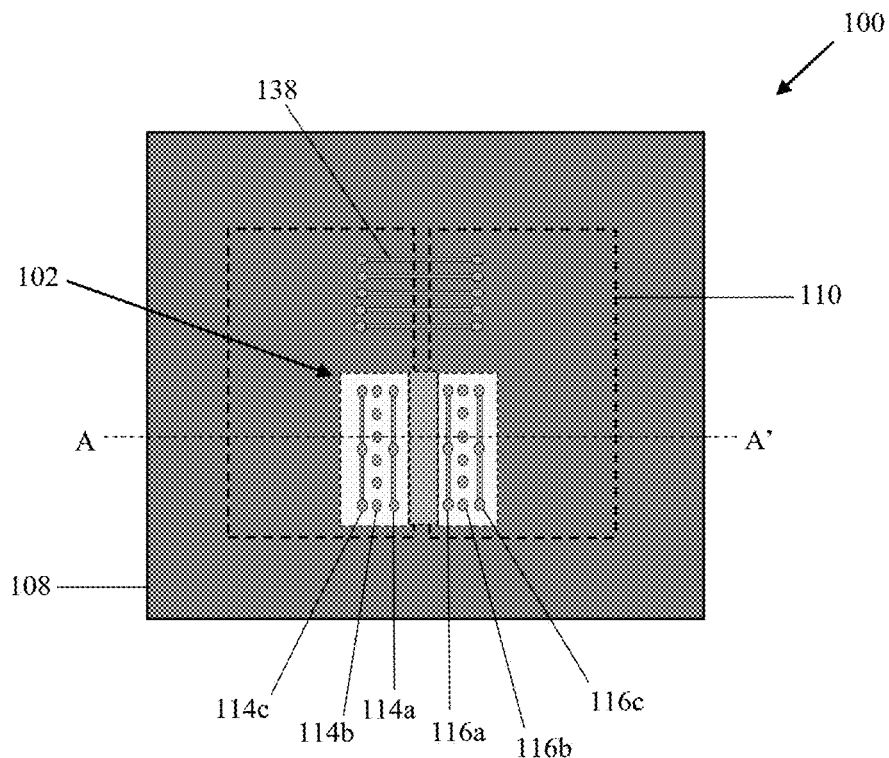
FIG. 1B shows a top view layout of the semiconductor package according to the aspect as shown in FIG. 1A.

FIG. 1B shows a top view layout of the semiconductor package 100 according to the aspect as shown in FIG. 1A. The substrate 108 may include a perimeter or footprint. The first die 104 may include a perimeter or footprint (shown as a dashed line). The third die 110 may include a perimeter or footprint (shown as a dashed line).

In the aspect shown in FIG. 1B, the footprint of the first die 104 and the footprint of the third die 110 fall within the perimeter of the substrate 108. The first die 104 and the third die 110 may be coupled by a plurality of horizontal or lateral interconnects 138. A portion of the bridge 102 including the first bridge metallization layer is shown to fall within the perimeter of the first die 104. Another portion of the bridge 102 including the second bridge metallization layer is shown to fall within the perimeter of the third die 110.

In the aspect shown in FIG. 1B, as mentioned in the above paragraphs, in the first bridge metallization layer, the signal interconnect layer 114b may be sandwiched between two voltage reference layers or planes (114a, 114c) to provide impedance control and shielding from electromagnetic interference, for example, signal crosstalk coupling.

In various aspects, in the second bridge metallization layer, the signal interconnect layer 116b may be sandwiched between two voltage reference layers or planes (116a, 116c) to provide impedance control and shielding from electromagnetic interference, for example, signal crosstalk coupling.

Figure 2:
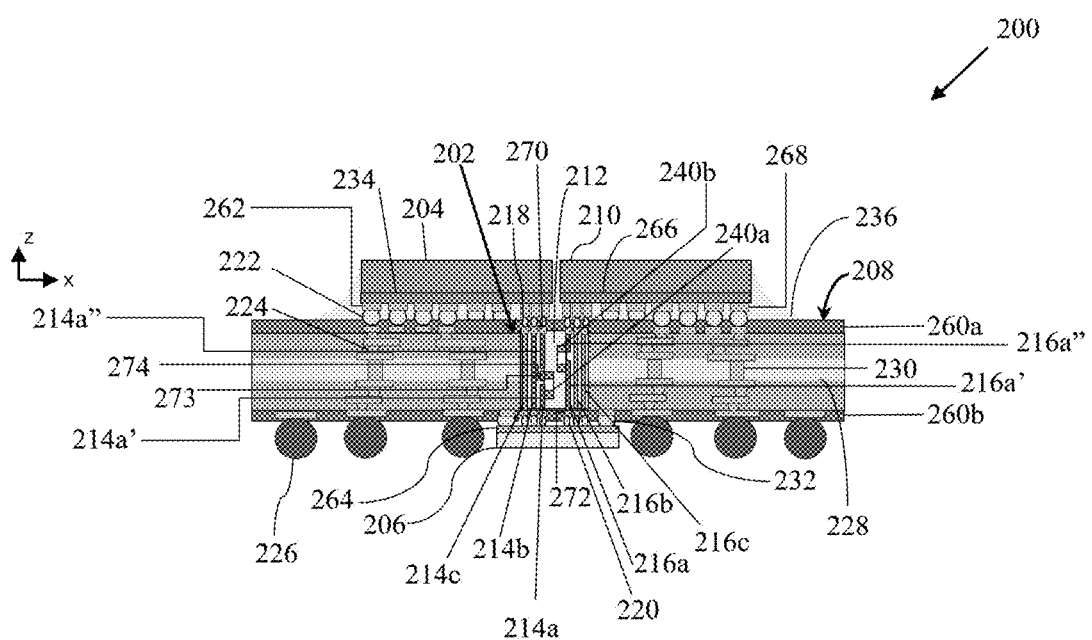
FIG. 2 shows a cross-sectional view of a semiconductor package with passive devices according to another aspect of the present disclosure.

FIG. 2 shows a cross-sectional view of a semiconductor package 200 according to another aspect of the present disclosure. The semiconductor package 200 may be similar to the semiconductor package 100 of FIG. 1A and may include additional variations and components as described below.

In FIG. 2, the semiconductor package 200 may have a substrate 208. The substrate 208 may have contact pads, electrical interconnects and routings, and other features, which may or may not be shown in any of the present figures and which are conventional features known to a person skilled in the art. Various couplings of the components may use conventional methods, including solder bonding, thermal compression bonding or other metal diffusion method. The substrate 208 may have one or more rigid core layer 228 for improved structural stability. The substrate 208 may include a PTH arrangement 230 therein. Alternatively, the substrate 208 may be a coreless substrate for a reduced form-factor. In other aspects, the substrate 208 may be part of a larger substrate that supports additional semiconductor packages and/or components. In another aspect, the substrate 208 may be a motherboard.

As shown in FIG. 2, a first (silicon) die 204, such as, but not limited to, a central processing unit (CPU), may be disposed on a top surface of a substrate 208. The top surface of the substrate 208 may be referred to as a die side. The first die 204 may include a first die metallization layer 234 that may be used to redistribute metal routing between transistor gates of the first die 204 and the substrate 208 in the semiconductor package 200. The first die metallization layer 234 may further include a plurality of conducting contact pads 262, e.g., a plurality of copper bump pads.

FIG. 2 further shows a second (silicon) die 206 may be, but not limited to, a memory device or a graphic processing unit (GPU), disposed on a bottom surface of the substrate 208. The bottom surface of the substrate 208 may be referred to as a land side that may be opposing to the die side. In other words, the first die 204 and the second die 206 may be arranged in parallel lateral planes. The second die 206 may include a second die metallization layer 264.

The semiconductor package 200 may include an opening or a cavity in the substrate 208 and a bridge 202 may be disposed in the opening. The bridge 202 may have an upper end at the top surface of the substrate 208 and a lower end at the bottom surface of the substrate 208. In other words, the bridge 202 may extend vertically between the die side and the land side of the substrate 208.

In an aspect, the upper end of the bridge 202 may extend beyond the top surface of the substrate 208. In another aspect, the lower end of the bridge 202 may extend beyond the bottom surface of the substrate 208. In a further aspect, both the upper and lower ends of the bridge 202 may extend beyond the top and bottom surfaces of the substrate 208.

The first die 204 on the top surface of the substrate 208 may at least partially extend over a first portion of the upper end of the bridge 202. The second die 206 on the bottom surface of the substrate 208 may at least partially extend over the lower end of the bridge 202. In various aspects, the first die 204 and the second die 206 may be arranged in parallel lateral planes, and the bridge 202 may couple the first die 204 to the second die 206 in a vertical manner (i.e., in a different plane to the lateral plane) and may be referred to as a vertical bridge. However, the contact pads 262 and 222 of the above aspects may be adjusted to achieve a leveled interconnect height between the silicon die(s) and the substrate 208.

A third (silicon) die 210 may be, but not limited to, a platform controller hub (PCH) chipset or a field programmable gate array (FPGA), disposed on the top surface of the substrate 208. The third die 210 on the top surface of the substrate 208 may at least partially extend over a second portion of the upper end of the bridge 202. The third die 210 may include a third die metallization layer 266 that may be used to redistribute metal routing between transistor gates of the third die 210 and the substrate 208 in the semiconductor package 200. The third die metallization layer 266 may further include a plurality of conducting contact pads 268, e.g., a plurality of copper bump pads.

The bridge 202 may further couple the third die 210 to the second die 206. In other words, the first die 204 and the second die 206 may be coupled to the third die 210 through the bridge 202 disposed within the opening in the substrate 208.

In the aspect shown in FIG. 2, the bridge 202 may include a bridge core 212. In various aspects, the bridge core 212 may be an organic core. The organic core may include, for example, an epoxy polymer resin and fiber weave composites. In alternative aspects, the bridge core 212 may be an inorganic core. The inorganic core may include, for example, a silicon or glass material.

The bridge core 212 may be positioned perpendicular to the die side and the land side. The bridge 212 may further include a plurality of bridge metallization layers. As shown in FIG. 2, a first bridge metallization layer (214a, 214b, 214c) may be disposed on a first bridge core surface and a second bridge metallization layer (216a, 216b, 216c) may be disposed on an opposing second bridge core surface. The first bridge metallization layer may couple the first die 204 to the second die 206. The second bridge metallization layer may couple the third die 210 to the second die 206.

The first bridge metallization layer may include a plurality of metal layers (214a, 214b, 214c) interleaved with dielectric layers. In other words, the first bridge metallization layer may include alternating layers of a metal layer and a bridge dielectric layer. In various aspects, the plurality of metal layers (214a, 214b, 214c) may be conductive plane and/or routing layers, e.g., signal routing and voltage reference layers isolated by dielectric layers, and may be a primary electrical coupling between the first die 204 and the second die 206.

In one aspect, the plurality of metal layers (214a, 214b, 214c) of the first bridge metallization layer may include a first voltage reference plane 214a, a second voltage reference plane 214b associated to a ground reference voltage (Vss) and a signal interconnect layer 214c arranged in this order such that the first and second voltage reference planes 214a and 214b are adjacent each other and only the second voltage reference plane 214b extends over the signal interconnect layer 214c. In other words, a metal layer of the plurality of metal layers of the first bridge metallization layer may include a signal interconnect layer 214c and another metal layer of the plurality of metal layers of the first bridge metallization layer may include the first voltage reference layer 214a or second voltage reference layer 214b interleaving with a bridge dielectric layer.

In an aspect, the first voltage reference layer 214a may include two or more isolated planes e.g., a first vertical plane 214a' and a second vertical plane 214a" extending over the second voltage reference layer 214b. In various aspects, the first isolated or vertical plane 214a' may be associated to a first power supply voltage e.g., a 1.0 volt (V) power supply. In one aspect, the second isolated or vertical plane 214a" may be associated to a second power supply voltage e.g., a 1.5 V power supply. In one aspect, the first voltage reference layer 214a may include one or more isolated planes or pads 273 adjacent the first and second vertical planes 214a' and 214a" that may be coupled to the second voltage reference plane 214b.

In various aspects, the semiconductor package 200 may further include one or more integrated passive component or device 240a. In one aspect, one integrated passive device 240a may include a decoupling capacitor, for example, a multi-layer ceramic capacitor (MLCC) or a silicon capacitor 240a, which may be coupled to the voltage reference planes or layers of the first bridge metallization layer to suppress the peak impedance of the power delivery network ($Z_{PDN}$).

In various aspects, an integrated passive device 240a may include a first decoupling capacitor, which may be coupled to a first vertical power (Vcc) plane or layer 214a' and the second voltage reference plane 214b through one or more Vss pads 273 within the first bridge metallization layer between the first die 204 and second die 206. In one aspect, the first Vcc plane 214a' and Vss plane 214b may reside at a different x-axis and may be coupled to each other through a bridge via 274.

The second bridge metallization layer may include a plurality of metal layers (216a, 216b, 216c) interleaved with dielectric layers. In other words, the second bridge metallization layer may include alternating layers of a metal layer and a bridge dielectric layer. In various aspects, the plurality of metal layers (216a, 216b, 216c) may be conductive plane and/or routing layers, e.g., signal routing and voltage reference layers isolated by dielectric layers, and may be a primary electrical coupling between the third die 210 and the second die 206.

In one aspect, the plurality of metal layers (216a, 216b, 216c) of the second bridge metallization layer may include a first voltage reference plane 216a, a signal interconnect layer 216b and a second voltage reference plane 216c arranged in this order. In an aspect, the first voltage reference layer 216a may include two or more isolated planes e.g., a first vertical plane 216a' and a second vertical plane 216a" extending over metal layer 216b. In various aspects, the first isolated or vertical plane 216a' may be associated to a ground reference voltage (Vss). In one aspect, the second isolated or vertical plane 216a" may be associated to a power supply voltage e.g., a 1.0 V power supply. In other words, a metal layer of the plurality of metal layers of the second bridge metallization layer may include a signal interconnect layer 216b and another metal layer of the plurality of metal layers of the second bridge metallization layer may include the first voltage reference layer 216a or second voltage reference layer 216c interleaving with a bridge dielectric layer.

In various aspects, another integrated passive device 240b may include a second decoupling capacitor which may be coupled to the first isolated or vertical Vss plane 216a' and the second isolated or vertical Vcc plane 216a" within layer 216a of the second bridge metallization layer between the third die 210 and second die 206. In an aspect, the first vertical plane 216a' and the second vertical plane 216a" reside at the same x-axis. In various aspects, the integrated passive component or devices (240a, 240b) may be embedded in the bridge core layer 228.

With respect to the first bridge metallization layer, the second bridge metallization layer, or both, a potential advantage of the present disclosure may be achieved by arranging the passive components, e.g., decoupling capacitors 240a and 240b, between two voltage reference segments, layers or planes to provide improved power delivery and reduced AC inductance loop. In various aspects, the bridge dielectric layer thickness between the signal interconnect layer and the voltage reference plane may range from approximately 15 µm to 50 µm. In various aspects, the thickness of each of the signal interconnect layer and the voltage reference plane may range from approximately 15 µm to 30 µm. In various aspects, the voltage reference layer may be coupled to a ground reference voltage (Vss) or a power supply voltage (Vcc).

In the aspect shown in FIG. 2, for the first bridge metallization layer side, the signal interconnect layer 214c may include a plurality of continuous metal traces coupled to first die bump pads 270 on the die side and to first land bump pads 272 on the land side. In this arrangement, the signal interconnect layer 214c may be coupled to the first die 204 via the first die bump pads 270 and first die bumps 218 on the die side. The first die bumps 218 on the die side may be coupled to the first die 204 through the first die metallization layer 234 including the plurality of conducting contact pads 262. The signal interconnect layer 214c may further be coupled to the second die 206 via the first land bump pads 272 and first land bumps 220 on the land side.

The foregoing arrangement may also be made for the second bridge metallization layer, as a mirror image of the first bridge metallization layer. In various aspects, the signal interconnect layer 216b may include a plurality of continuous metal traces coupled to first die bump pads 270 on the die side and to first land bump pads 272 on the land side. In this arrangement, the signal interconnect layer 216b may be coupled to the third die 210 via the first die bump pads 270 and first die bumps 218 on the die side. The first die bumps 218 on the die side may be coupled to the third die 210 through the third die metallization layer 266 including a plurality of conducting contact pads 268. The signal interconnect layer 216b may further be coupled to the second die 206 via the first land bump pads 272 and first land bumps 220 on the land side.

With the above arrangement, high density die-to-die interconnects with robust power delivery decoupling solution and EMI shielding may be achieved through the bridge 202.

In various aspects, the width of a metal trace of the plurality of continuous metal traces may range from approximately 7 μm to 30 μm and the spacing between two adjacent metal traces may range from approximately 7 μm to 50 μm.

In various aspects shown in FIG. 2, a solder resist layer 260a may be at least partially disposed over the first die bump pads 270 and another solder resist layer 260b may be at least partially disposed over the first land bump pads 272.

In various aspects, the second die 206 may be coupled to the substrate 208 through a second land-side bump 232 to provide power supply and/or signal transmissions.

In a further aspect, a further second die (not shown) may be provided on the land side and may include a passive device such as, but not limited to, a silicon capacitor.

In various aspects, the first die 204 and the third die 210 may be connected to a printed circuit board or motherboard (not shown), through a conventional routing setup. In one aspect, the first die 204 and the third die 210 may communicate to the circuit board through a second die-side bump 222, a package trace, a vertical via interconnect 224 and a solder ball 226. Further, the substrate 208 may include a core layer 228 and the substrate 208 may include a plated-through hole arrangement 230 therein. An underfill layer 236 may be deposited to cover and protect the conductive components of the semiconductor package 200 in a conventional manner.

In the aspect shown in FIG. 2, the first die-side bump 218 may have a first dimension and the second die-side bump 222 may have a second dimension. The second dimension may be greater than the first dimension. The term "dimension", in relation to the first dimension and the second dimension, may refer to physical bump diameter and bump pitches.

FIGS. 3A through 3G show cross-sectional views directed to an exemplary simplified process flow for forming a semiconductor package with high-density vertical die-to-die interconnects bridge, according to an aspect that is generally similar to that shown in FIG. 1A of the present disclosure.

Figure 3A:
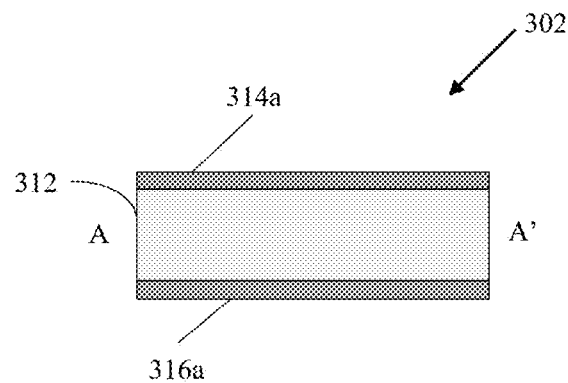
FIGS. 3A through 3L show cross-sectional views directed to an exemplary simplified process flow for a method for forming a semiconductor package with high-density vertical die-to-die interconnects bridge, according to an aspect that is generally similar to that shown in FIG. 1A of the present disclosure.

FIG. 3A shows a cross-sectional view of a bridge according to an aspect of the present disclosure. The cross-section is taken along the A-A' line of FIG. 3B. A bridge 302 may be provided by forming a first metal layer 314a on a bridge core 312 on a first bridge core surface. A second metal layer 316a may be formed on the bridge core 312 on a second bridge core surface. Conventional techniques may be employed, such as but not limited to, a hot-press or lamination process.

Figure 3B:
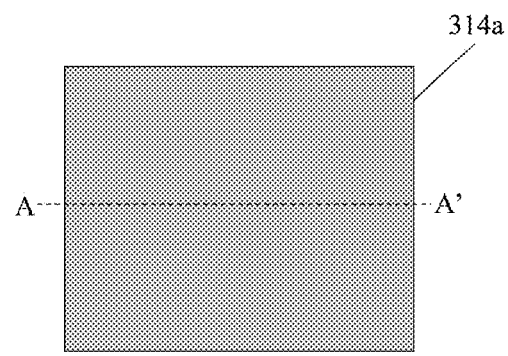

FIG. 3B shows a top view of the bridge 302 formed in this operation, which may show a solid plane of the first metal layer 314a.

Figure 3C:
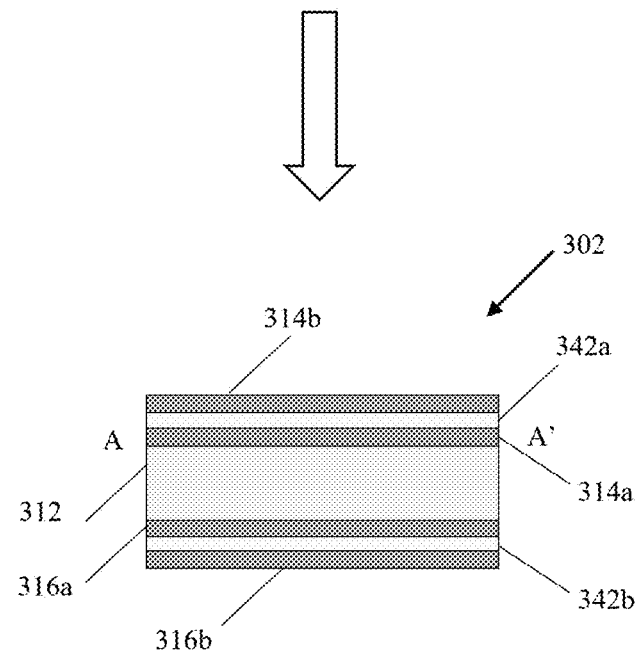

FIG. 3C shows a cross-sectional view of the formation of the metal layer buildup of the bridge 302. The cross-section is taken along the A-A' line of FIG. 3D. A first dielectric layer 342a may be formed on the first metal layer 314a. A third metal layer 314b may then be formed on the first dielectric layer 342a. A second dielectric layer 342b may be formed on the second metal layer 316a. A fourth metal layer 316b may then be formed on the second dielectric layer 342b. Conventional techniques may be employed, such as but not limited to, a hot-press or lamination process to form the metal layer buildup.

Figure 3D:
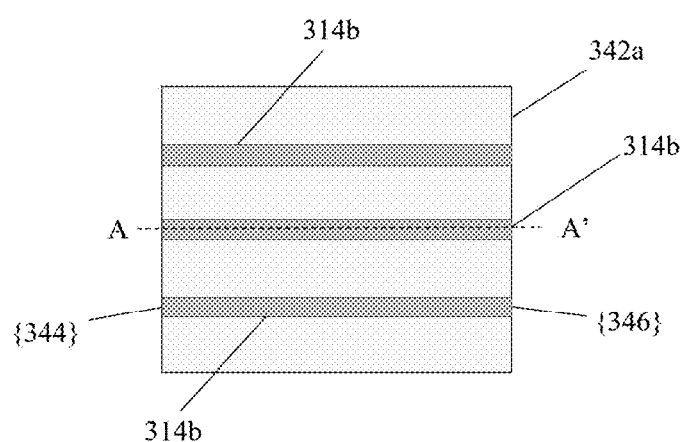

FIG. 3D shows a top view of the bridge 302 formed in this operation, which may show trace routing 314b formed by an etching process of the third metal layer 314b. Conventional techniques may be employed, such as but not limited to, photolithography and etching e.g., chemical wet-etch or dry-etch process. An upper end 344 and a lower end 346 of the bridge 302 may be formed, which may function as terminals of the bridge 302. In various aspects, the upper end 344 and lower end 346 may be configured to have a geometry e.g., a width geometry larger than a width geometry of remaining portion of the trace routing 314b. In another aspect, the trace routing 314b may be configured in a non-linear manner, for example, the upper end 344 is offset from the lower end 346.

Figure 3E:
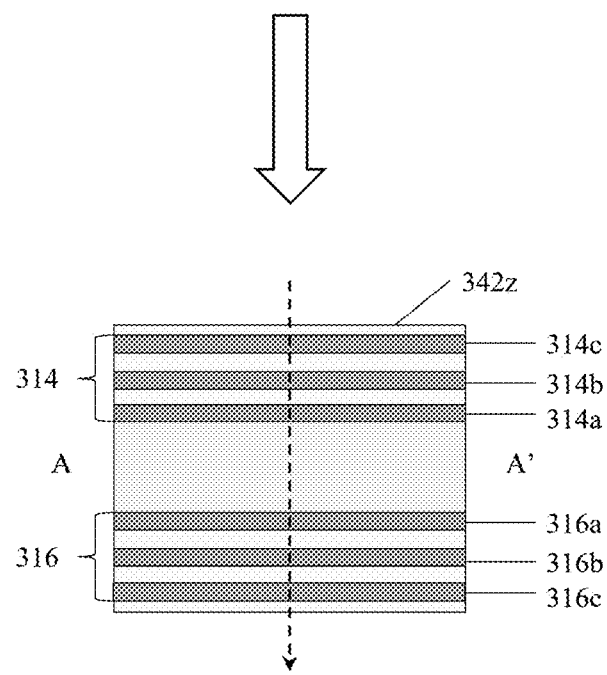

FIG. 3E shows a cross-sectional view of a buildup panel prior to singulation or separation. The cross-section is taken along the A-A' line of FIG. 3F. The metal buildup operation may be continued until a desired number of trace routing and/or metal layer may be obtained. In various aspects, further dielectric layers may be formed on underlying metal layers in an alternating arrangement similar to the bridge illustrated in FIG. 1A. The top of the buildup panel may be finished off with a final dielectric layer 342z.

In the aspect shown in FIG. 3E, a first bridge metallization layer 314 including a plurality of metal layers (314a, 314b, 314c) may be formed on the first bridge core surface, the plurality of metal layers (314a, 314b, 314c) may be interleaved with dielectric layers. A second bridge metallization layer 316 including a plurality of metal layers (316a, 316b, 316c) may be formed on the second bridge core surface, the plurality of metal layers (316a, 316b, 316c) may be interleaved with dielectric layers.

Figure 3F:
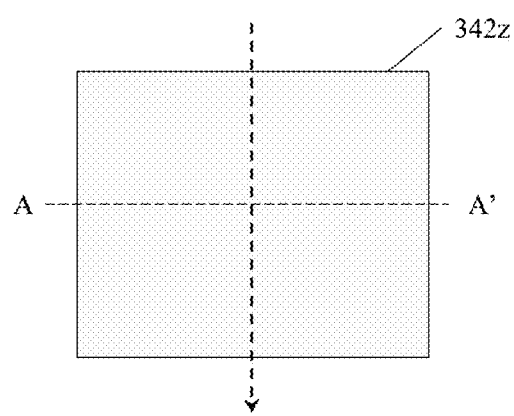

FIG. 3F shows a top view of the bridge formed in this operation, which may show the final dielectric layer 342z. A cutting process or singulation, for example, mechanical or laser cutting, may be performed to cut the panel in the direction of the arrow shown.

Figure 3G:
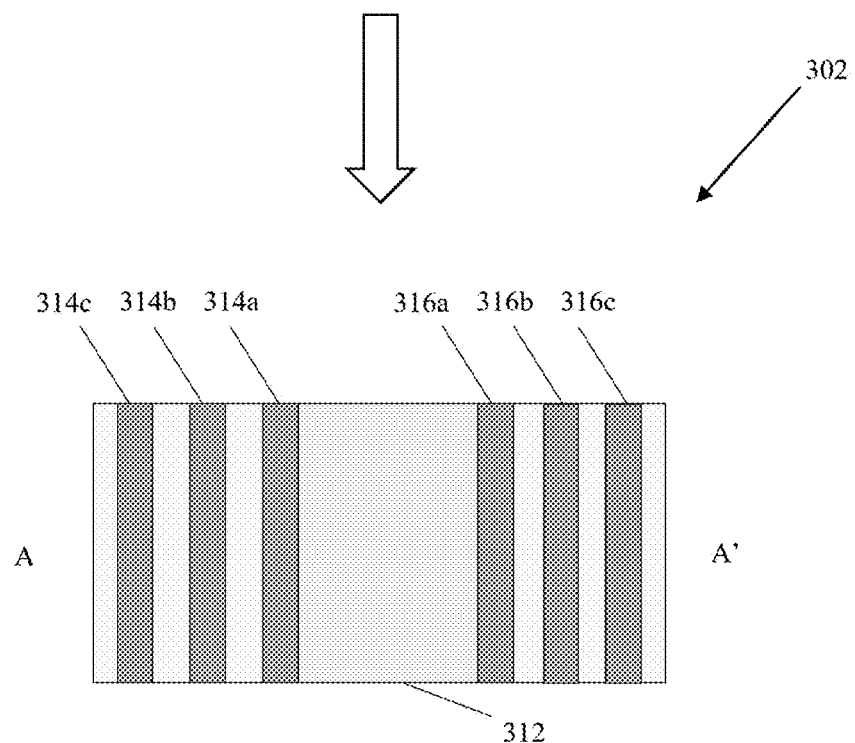
Figure 3H:
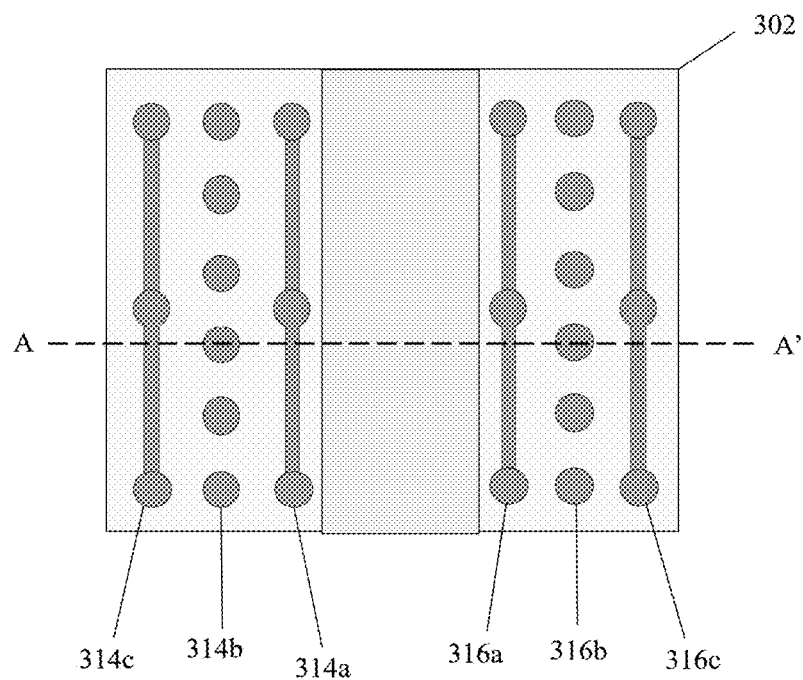

FIG. 3G shows a bridge 302 according to the present disclosure illustrated in FIG. 1A, which may be formed after the panel singulation. The cross-section is taken along the A-A' line of FIG. 3H.

Figure 3I:
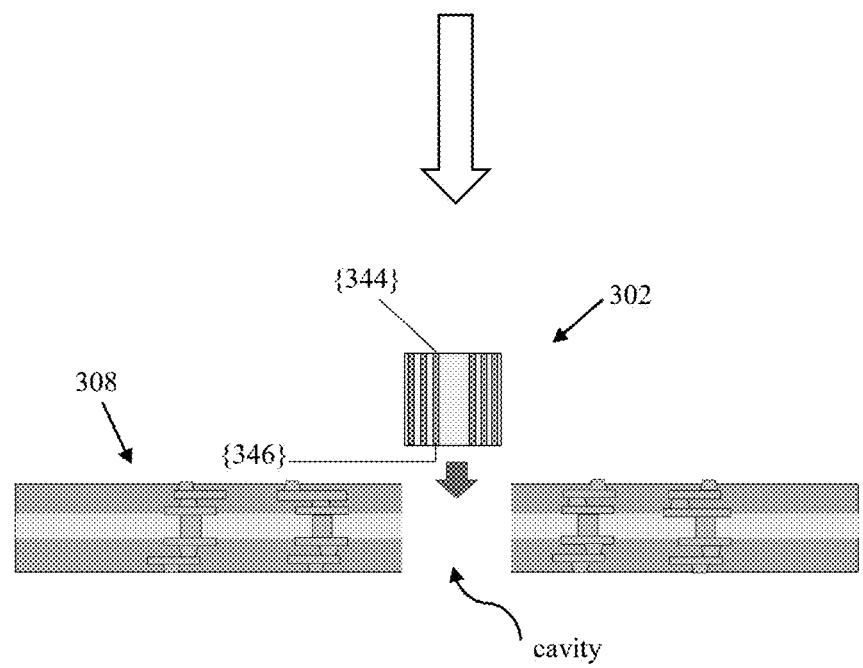

FIG. 3I shows disposing the bridge 302 into an opening or cavity of a substrate 308 via conventional processes such as component plugging and curing process. The bridge 302 may be positioned in a manner such that the bridge 302 may have an upper end 344 at the top surface of the substrate 308 and a lower end 346 at the bottom surface of the substrate 308.

Figure 3J:
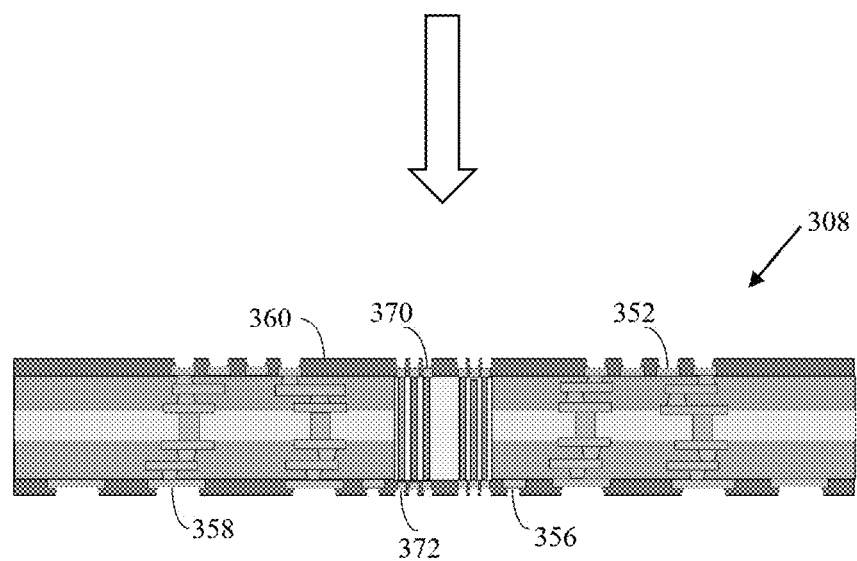

FIG. 3J shows disposing surface finish layers on the substrate 308 by conventional processes including electroplating, photolithography and etching process. The surface finish layers may include a first die pad 370, a second die pad 352, a first land pad 372, a second land pad 356 and a third land pad 358. A solder resist layer 360 may further be formed over the various die pads and the various land pads to isolate the pads from one another.

Figure 3K:
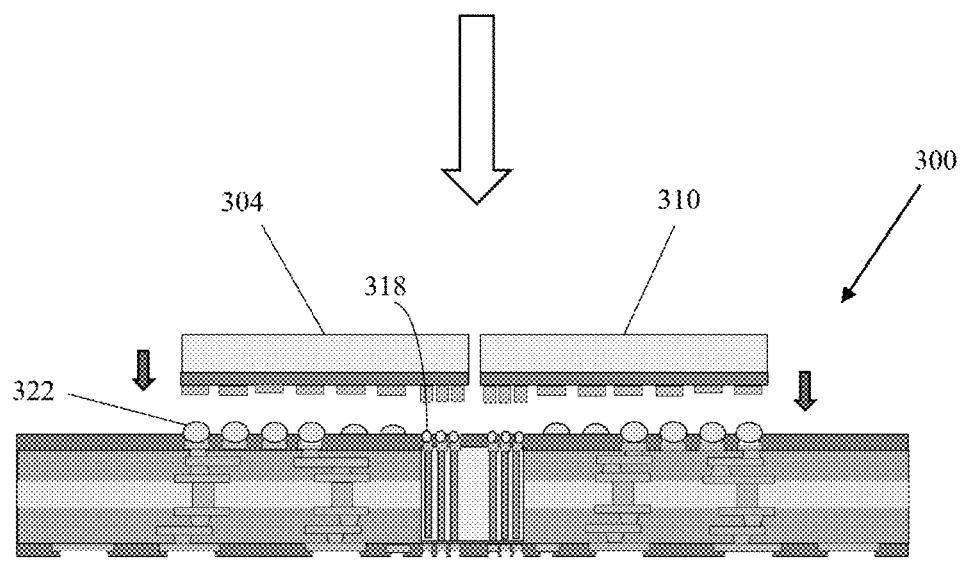

FIG. 3K shows the attachment of a first die 304 and a third die 310 on the semiconductor package 300 die side by conventional processes such as reflow or thermal compression bonding process. The first die 304 and the third die 310 may be coupled to the substrate 308 via first die bumps 318 and second die bumps 322 on the die side.

Figure 3L:
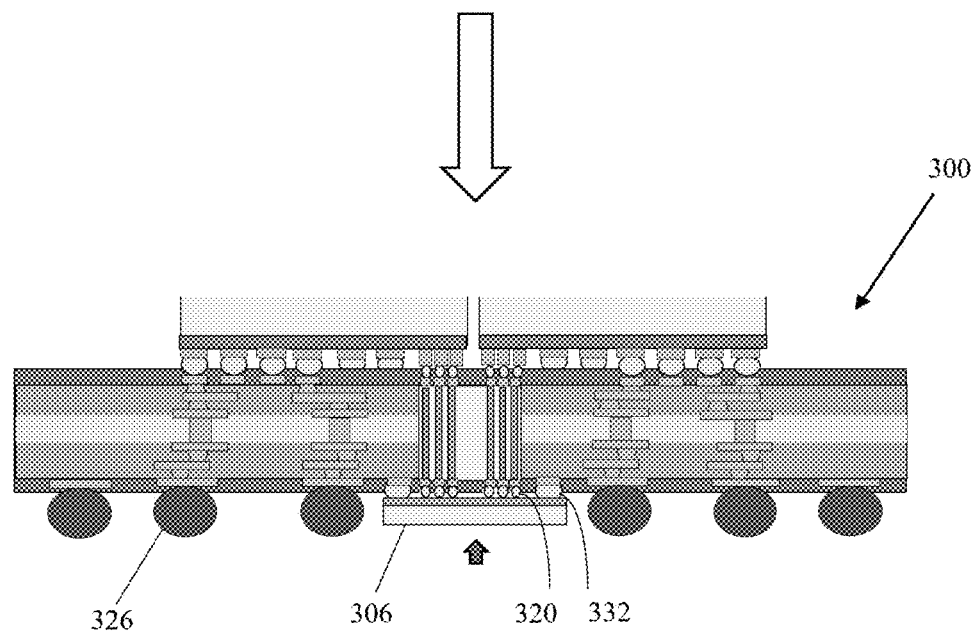

FIG. 3L shows the attachment of components or ball grid array (BGA) on the semiconductor package 300 land side by conventional processes including reflow or thermal compression bonding process. A second die 306 may be coupled to the substrate 308 via first land bumps 320 and second land bumps 332 on the land side. Solder balls 326 may be coupled to the substrate 308 and further coupled to a circuit board (not shown).

Figure 4:
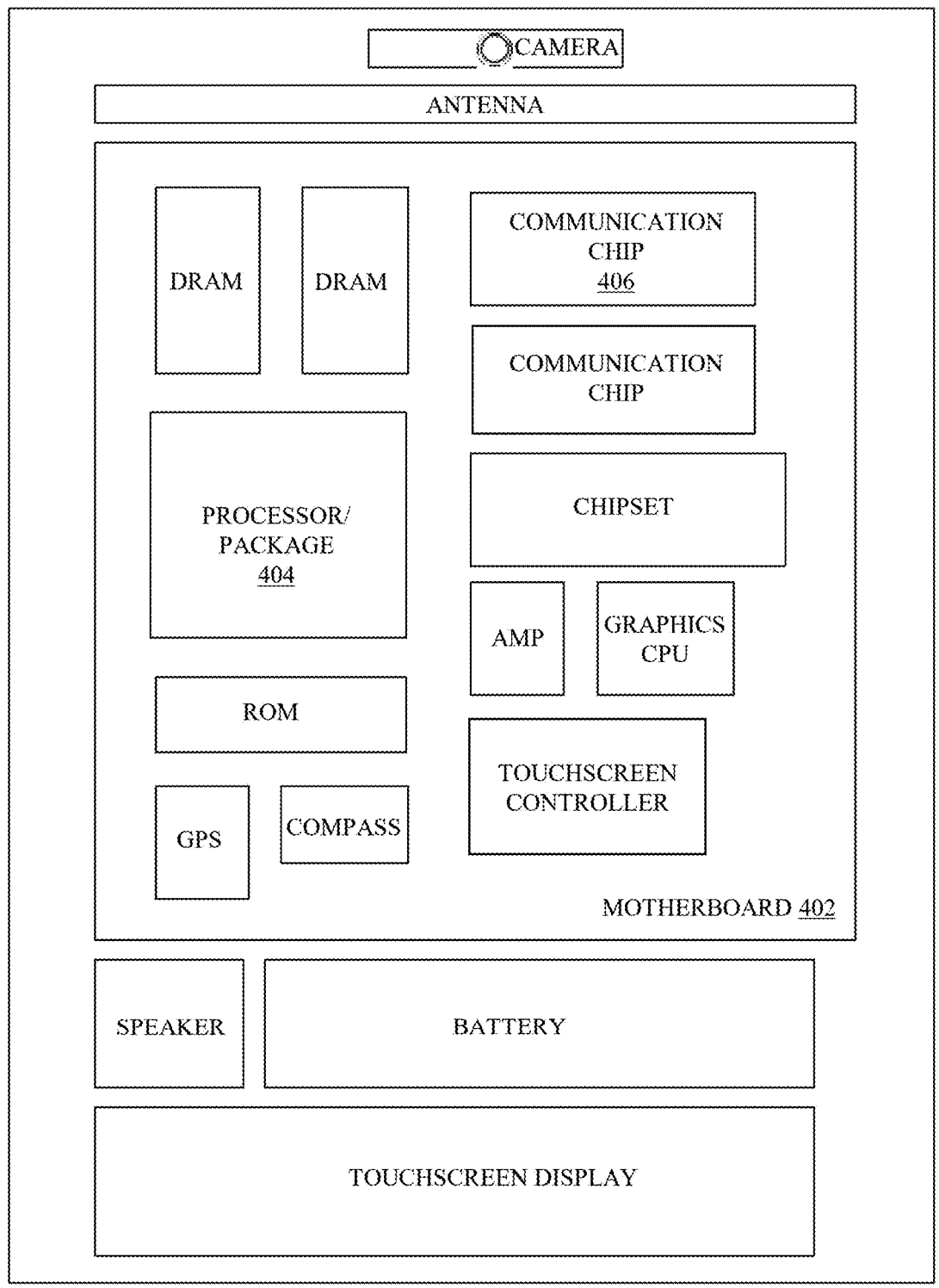
FIG. 4 shows an illustration of a computing device that includes a semiconductor package according to a further aspect of the present disclosure.

Aspects of the present disclosure may be implemented into a system using any suitable hardware and/or software. FIG. 4 schematically illustrates a computing device 400 that may include a semiconductor package as described herein, in accordance with some aspects. The computing device 400 may house a board such as a motherboard 402. The motherboard 402 may include a number of components, including but not limited to a processor 404 and at least one communication chip 406. The processor 404, which may have a semiconductor package according to the present disclosure, may be physically and electrically coupled to the motherboard 402. In some implementations, the at least one communication chip 406 may also be physically and electrically coupled to the motherboard 402. In further implementations, the communication chip 406 may be part of the processor or package 404.

Depending on its applications, computing device 400 may include other components that may or may not be physically and electrically coupled to the motherboard 402. These other components may include, but are not limited to, volatile memory (e.g. DRAM), non-volatile memory (e.g. ROM), flash memory, a graphics processor, a digital signal processor, a cryptoprocessor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 404 of the computing device 400 may be packaged in a semiconductor package with an embedded vertical bridge as described herein, and/or other semiconductor devices may be packaged together in a semiconductor package with an embedded vertical bridge as described herein.

The communication chip 406 may enable wireless communications for the transfer of data to and from the computing device 400. The term "wireless" and its derivatives may be used to describe circuits, devices, systems, methods, techniques, communications channels, etc. that may communicate data through the use of modulated electromagnetic radiation through a non-solid medium. The term does not imply that the associated devices do not contain any wires, although in some aspects they might not. The communication chip 406 may implement any of a number of wireless standards or protocols, including but not limited to Institute for Electrical and Electronic Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 406 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 406 may operate in accordance with other wireless protocols in other aspects.

The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

In various implementations, the computing device 400 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In an aspect, the computing device 400 may be a mobile computing device. In further implementations, the computing device 400 may be any other electronic device that processes data.

Figure 5:
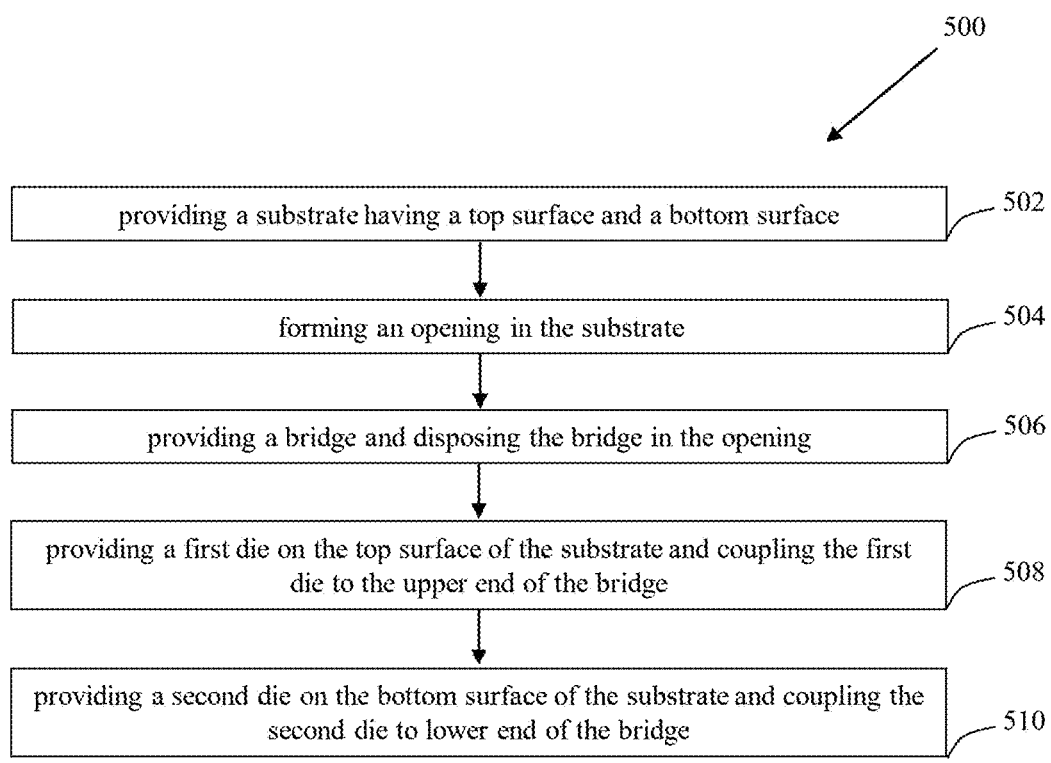
FIG. 5 shows a flow chart illustrating a method for forming a semiconductor package according to an aspect of the present disclosure.

FIG. 5 shows a flow chart illustrating a method 500 of forming a semiconductor package according to an aspect of the present disclosure.

As shown in FIG. 5, at operation 502, the method 500 of forming a semiconductor package may include providing a substrate. The substrate may have a top surface and a bottom surface. At operation 504, the method may include forming an opening in the substrate. At operation 506, the method may include providing a bridge and disposing the bridge in the opening. The bridge may have an upper end at the top surface of the substrate and a lower end at the bottom surface of the substrate. At operation 508, the method may include providing a first die on the top surface of the substrate and coupling the first die to the upper end of the bridge, wherein the first die at least partially extending over a first portion of the upper end of the bridge. At operation 510, the method may include providing a second die on the bottom surface of the substrate and coupling the second die to lower end of the bridge, wherein the second die at least partially extending over the lower end of the bridge.

It will be understood that the above operations described above relating to FIG. 5 are not limited to this particular order. Any suitable, modified order of operations may be used.

EXAMPLES

Example 1 may include a device including a substrate having a top surface and a bottom surface; an opening in the substrate; a bridge in the opening, the bridge having an upper end at the top surface of the substrate and a lower end at the bottom surface of the substrate; a first die on the top surface of the substrate at least partially extending over a first portion of the upper end of the bridge; and a second die on the bottom surface of the substrate at least partially extending over the lower end of the bridge, wherein the bridge couples the first die to the second die.

Example 2 may include the device of example 1 and/or any other example disclosed herein, further including a third die on the top surface of the substrate at least partially extending over a second portion of the upper end of the bridge, wherein the bridge further couples the third die to the second die.

Example 3 may include the device of example 2 and/or any other example disclosed herein, wherein the bridge further includes a bridge core and a plurality of bridge metallization layers.

Example 4 may include the device of example 3 and/or any other example disclosed herein, wherein the bridge core further includes an organic core, wherein the organic core includes an epoxy polymer resin and fiber weave composites, or an inorganic core, wherein the inorganic core includes silicon or glass materials.

Example 5 may include the device of example 3 and/or any other example disclosed herein, wherein the plurality of bridge metallization layers include a first bridge metallization layer disposed on a first bridge core surface, wherein the first bridge metallization layer couples the first die to the second die.

Example 6 may include the device of example 5 and/or any other example disclosed herein, wherein the first bridge metallization layer includes a plurality of metal layers interleaved with dielectric layers.

Example 7 may include the device of example 6 and/or any other example disclosed herein, wherein the plurality of metal layers further includes a first reference plane, a signal interconnect layer and a second reference plane.

Example 8 may include the device of example 7 and/or any other example disclosed herein, wherein the signal interconnect layer further includes a plurality of metal traces configured to transmit a data signal and is sandwiched between the first and second reference planes, wherein the first and second reference planes are configured to transmit power or to provide impedance control and shielding from electromagnetic interference.

Example 9 may include the device of example 5 and/or any other example disclosed herein, wherein the plurality of bridge metallization layers further includes a second bridge metallization layer disposed on a second bridge core surface opposing the first bridge core surface, wherein the second bridge metallization layer couples the third die to the second die.

Example 10 may include the device of example 9 and/or any other example disclosed herein, wherein the second bridge metallization layer includes a plurality of metal layers interleaved with dielectric layers.

Example 11 may include the device of example 10 and/or any other example disclosed herein, wherein the plurality of metal layers further includes a first reference plane, a signal interconnect layer and a second reference plane.

Example 12 may include the device of example 11 and/or any other example disclosed herein, wherein the signal interconnect layer further includes a plurality of metal traces configured to transmit a data signal and is sandwiched between the first and second reference planes, wherein the first and second reference planes are configured to transmit power or to provide impedance control and shielding from electromagnetic interference.

Example 13 may include the device of example 4 and/or any other example disclosed herein, further including at least one electronic component disposed within the bridge core, the at least one electronic component coupled to the first bridge metallization layer or the second bridge metallization layer.

Example 14 may include the device of example 13 and/or any other example disclosed herein, the at least one electronic component includes a multi-layer ceramic capacitor and/or a silicon capacitor.

Example 15 may include a computing device including a device including a substrate having a top surface and a bottom surface; an opening in the substrate; a bridge in the opening, the bridge having an upper end at the top surface of the substrate and a lower end at the bottom surface of the substrate; a first die on the top surface of the substrate at least partially extending over a first portion of the upper end of the bridge; a second die on the bottom surface of the substrate at least partially extending over the lower end of the bridge, wherein the bridge couples the first die to the second die; and a circuit board, wherein the device is coupled to the circuit board.

Example 16 may include the computing device of example 15 and/or any other example disclosed herein, further including a third die on the top surface of the substrate at least partially extending over a second portion of the upper end of the bridge, wherein the bridge further couples the third die to the second die.

Example 17 may include the computing device of example 15 and/or any other example disclosed herein, wherein the bridge further includes a bridge core, a first bridge metallization layer, and a second bridge metallization layer, the computing device further including at least one electronic component disposed within the bridge core, the at least one electronic component coupled to the first bridge metallization layer or the second bridge metallization layer.

Example 18 may include a method including providing a substrate having a top surface and a bottom surface; forming an opening in the substrate; providing a bridge; disposing the bridge in the opening, the bridge having an upper end at the top surface of the substrate and a lower end at the bottom surface of the substrate; providing a first die on the top surface of the substrate and coupling the first die to the upper end of the bridge, wherein the first die at least partially extending over a first portion of the upper end of the bridge; and providing a second die on the bottom surface of the substrate and coupling the second die to lower end of the bridge, wherein the second die at least partially extending over the lower end of the bridge.

Example 19 may include the method of example 18 and/or any other example disclosed herein, further including providing a third die on the top surface of the substrate and coupling the third die to the bridge to form a connection with the second die, wherein the third die at least partially extending over a second portion of the upper end of the bridge.

Example 20 may include the method of example 19 and/or any other example disclosed herein, wherein providing the bridge further includes providing a bridge core having a first bridge core surface and an opposing second bridge core surface; forming a first bridge metallization layer on the first bridge core surface by depositing a plurality of metal layers interleaved with dielectric layers; and forming a second bridge metallization layer on the second bridge core surface by depositing a plurality of metal layers interleaved with dielectric layers.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") used herein may be understood as electrically coupled or as mechanically coupled, e.g. attached or fixed or mounted, or just in contact without any fixation, and it will be understood that both direct coupling and indirect coupling (in other words, coupling without direct contact) may be provided.

While the present disclosure has been particularly shown and described with reference to specific aspects, it should be understood by persons skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   a substrate having a top surface and a bottom surface;
   an opening in the substrate;
   a bridge in the opening, the bridge having an upper end at the top surface of the substrate and a lower end at the bottom surface of the substrate;
   a first die on the top surface of the substrate at least partially extending over a first portion of the upper end of the bridge; and
   a second die on the bottom surface of the substrate at least partially extending over the lower end of the bridge, wherein the bridge couples the first die to the second die;
   further comprising a third die on the top surface of the substrate at least partially extending over a second portion of the upper end of the bridge, wherein the bridge further couples the third die to the second die.

2. The device of claim 1, wherein the bridge further comprises a bridge core and a plurality of bridge metallization layers.

3. The device of claim 2, wherein the bridge core further comprises:
   an organic core, wherein the organic core comprises an epoxy polymer resin and fiber weave composites; or
   an inorganic core, wherein the inorganic core comprises silicon or glass materials.

4. The device of claim 3, further comprising at least one electronic component disposed within the bridge core, the at least one electronic component coupled to the first bridge metallization layer or the second bridge metallization layer.

5. The device of claim 4, wherein the at least one electronic component comprises a multi-layer ceramic capacitor and/or a silicon capacitor.

6. The device of claim 2, wherein the plurality of bridge metallization layers further comprises a first bridge metallization layer disposed on a first bridge core surface, wherein the first bridge metallization layer couples the first die to the second die.

7. The device of claim 6, wherein the first bridge metallization layer comprises a plurality of metal layers interleaved with dielectric layers.

8. The device of claim 7, wherein the plurality of metal layers further comprises a first reference plane, a signal interconnect layer and a second reference plane.

9. The device of claim 8, wherein the signal interconnect layer further comprises a plurality of metal traces configured to transmit a data signal and is sandwiched between the first and second reference planes, wherein the first and second reference planes are configured to transmit power or to provide impedance control and shielding from electromagnetic interference.

10. The device of claim 6, wherein the plurality of bridge metallization layers further comprises a second bridge metallization layer disposed on a second bridge core surface opposing the first bridge core surface, wherein the second bridge metallization layer couples the third die to the second die.

11. The device of claim 10, wherein the second bridge metallization layer comprises a plurality of metal layers interleaved with dielectric layers.

12. The device of claim 11, wherein the plurality of metal layers further comprises a first reference plane, a signal interconnect layer and a second reference plane.

13. The device of claim 12, wherein the signal interconnect layer further comprises a plurality of metal traces configured to transmit a data signal and is sandwiched between the first and second reference planes, wherein the first and second reference planes are configured to transmit power or to provide impedance control and shielding from electromagnetic interference.

14. A computing device comprising:
   a device comprising:
      a substrate having a top surface and a bottom surface;
      an opening in the substrate;
      a bridge in the opening, the bridge having an upper end at the top surface of the substrate and a lower end at the bottom surface of the substrate;
      a first die on the top surface of the substrate at least partially extending over a first portion of the upper end of the bridge;
      a second die on the bottom surface of the substrate at least partially extending over the lower end of the bridge, wherein the bridge couples the first die to the second die; and
      a circuit board, wherein the device is coupled to the circuit board;
      further comprising a third die on the top surface of the substrate at least partially extending over a second portion of the upper end of the bridge, wherein the bridge further couples the third die to the second die.

15. The computing device of claim 14, wherein the bridge further comprises a bridge core, a first bridge metallization layer, and a second bridge metallization layer, the computing device further comprising at least one electronic component disposed within the bridge core, the at least one electronic component coupled to the first bridge metallization layer or the second bridge metallization layer.

16. A method comprising:
providing a substrate having a top surface and a bottom surface;
forming an opening in the substrate;
providing a bridge;
disposing the bridge in the opening, the bridge having an upper end at the top surface of the substrate and a lower end at the bottom surface of the substrate;
providing a first die on the top surface of the substrate and coupling the first die to the upper end of the bridge, wherein the first die at least partially extending over a first portion of the upper end of the bridge; and
providing a second die on the bottom surface of the substrate and coupling the second die to lower end of the bridge, wherein the second die at least partially extending over the lower end of the bridge;
further comprising providing a third die on the top surface of the substrate and coupling the third die to the bridge to form a connection with the second die, wherein the third die at least partially extending over a second portion of the upper end of the bridge.

17. The method of claim 16, wherein providing the bridge further comprises:
providing a bridge core having a first bridge core surface and an opposing second bridge core surface;
forming a first bridge metallization layer on the first bridge core surface by depositing a plurality of metal layers interleaved with dielectric layers; and
forming a second bridge metallization layer on the second bridge core surface by depositing a plurality of metal layers interleaved with dielectric layers.

\* \* \* \* \*